(12) United States Patent
Choi et al.

(10) Patent No.: US 6,270,583 B1
(45) Date of Patent: Aug. 7, 2001

(54) CLOSED TYPE SEMICONDUCTOR WET THERMAL OXIDATION APPARATUS

(75) Inventors: Byung-doo Choi, Seoul; Jeong-kwan Lee, Anyang; Keum-hee Lee, Seoul, all of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/413,639

(22) Filed: Oct. 6, 1999

(30) Foreign Application Priority Data

Oct. 9, 1998 (KR) .................................................. 98-42176

(51) Int. Cl.⁷ .................................................. C23C 16/00
(52) U.S. Cl. .............................................................. 118/726
(58) Field of Search .............................. 118/726, 723 VE

(56) References Cited

U.S. PATENT DOCUMENTS 4,315,479 * 2/1982 Toole et al. ........................... 118/726
5,458,685 * 10/1995 Hasebe et al. ........................ 118/724

* cited by examiner

*Primary Examiner*—Richard Bueker
(74) *Attorney, Agent, or Firm*—Sughrue, Mion, Zinn, Macpeak & Seas, PLLC

(57) ABSTRACT

A compound semiconductor wet thermal oxidation apparatus includes a chamber unit having an inside tube containing water and supporting a specimen and an outside tube encompassing the inside tube forming a seal, and a heating unit having a furnace for heating the specimen and the water.

9 Claims, 3 Drawing Sheets

CLOSED TYPE SEMICONDUCTOR WET THERMAL OXIDATION APPARATUS

BACKGROUND OF THE INVENTION

1. Field of the Invention

The present invention relates to an apparatus for wet thermal oxidation of a semiconductor specimen, used in a compound semiconductor fabrication process.

2. Description of the Related Art

Various systems and apparatuses for oxidizing a specimen in a compound semiconductor fabrication process have been suggested. A typical oxidation apparatus is shown in FIG. 1, which uses an open-type oxidation system in which external gas continuously flows in.

That is, referring to the drawing, the open-type system oxidation apparatus includes a tank 10 containing water, a heating furnace installed encompassing the tank 10 to heat the water in the tank 10, a pipe 12 through which vapor generated by heating the water in the tank 10 flows, a chamber 14 where a specimen 100 is located, a holder 15 installed at the chamber 14 for supporting the specimen 100, and a discharge pipe 17 through which the vapor is discharged. Also, valves 18 are installed at the pipe 12, if necessary. A heating furnace 16 for heating the chamber 14 is installed adjacent to the chamber 14.

In the present apparatus, nitrogen $N_2$ is used as a carrier gas to carry the vapor generated in the tank 10. The nitrogen flows in the pipe 12 and the amount of flow is appropriately controlled by a flow controller 13.

In the operation of the conventional oxidation apparatus having the above structure, first, the heating furnaces 11 and 16 are driven to heat the tank 10 containing water and the chamber 14 where the specimen 100 subject to oxidation is placed. Here, the tank 10 is heated to a temperature between 80° C. and 100° C. to generate vapor and the chamber 14 is heated to a temperature between 350° C. and 500° C. When the tank 10 and the chamber 14 are heated to appropriate temperatures, the specimen 100 supported by a holder 15 is placed in the chamber 14.

Next, as the amount of nitrogen flowing in is controlled by the flow controller 13, the nitrogen flows in the chamber 14 along with the vapor generated in the tank 10 and flows through the pipe 12 so that oxidation of the specimen 100 begins.

As the external nitrogen and vapor continuously flows in the chamber 14 in the oxidation apparatus adopting the open-type system, the oxidation atmosphere in the chamber 14 is barely maintained in a constant state due to change in the external circumstances. Also, when the nitrogen gas is horizontally provided with respect to the specimen 100, as the nitrogen gas is gradually heated while proceeding due to the high temperature in the chamber 14, the temperature of the nitrogen gas located at the position far away from an end portion of the pipe 12 through which the nitrogen gas is provided is higher than that of the nitrogen gas near the end portion of the pipe 12. The unevenness of the temperature of the nitrogen gas consequently serves as a hindrance to uniform oxidation throughout the specimen 100. Such tendency becomes severe as the length of the specimen 100 increases. Thus, uniformity at oxidation is lowered.

Further, vapor is condensed at an inner wall of the pipe 12 where the vapor flows and water drops are formed. The water drops are expelled into the chamber 14 by a gas such as nitrogen so that the specimen 100 may be wet, which lowers reliability and representation of a compound semiconductor specimen.

The above problem also occurs when the pipe 12 is installed perpendicular to the specimen 100 in the chamber 14. Thus, the specimen wetting phenomenon due to water drops occurs more frequently.

SUMMARY OF THE INVENTION

To solve the above problem, it is an objective of the present invention to provide a closed type semiconductor wet thermal oxidation apparatus adopting a closed type system to be capable of isolating the system of the oxidation apparatus from external circumstances so that reliability and reproduction of an oxidation process can be secured.

Accordingly, to achieve the above objective, there is provided a compound semiconductor wet thermal oxidation apparatus which comprises a chamber unit including an inside tube containing water and supporting a specimen and an outside tube encompassing the inside tube forming a seal, and a heating unit including a furnace for heating the specimen and the water.

It is preferred in the present invention that the chamber unit comprises an installation base where the inside tube is supported and the outside tube is detachably installed, and a support base detachably coupled to the installation base forming a seal and installed to be capable of moving up and down with respect to the heating unit.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
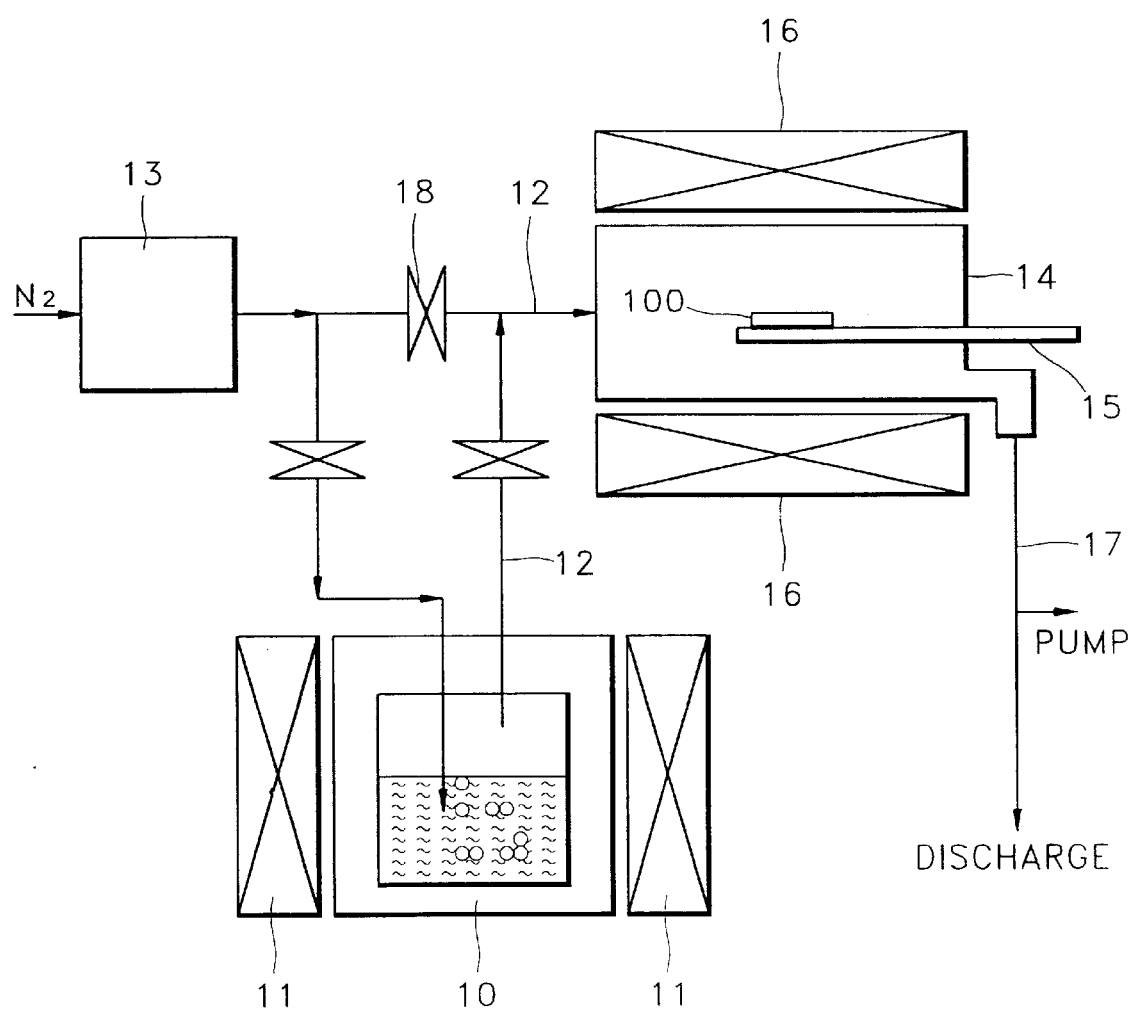
FIG. 1 is a sectional view showing the structure of a conventional open-type semiconductor wet thermal oxidation apparatus.
Figure 2:
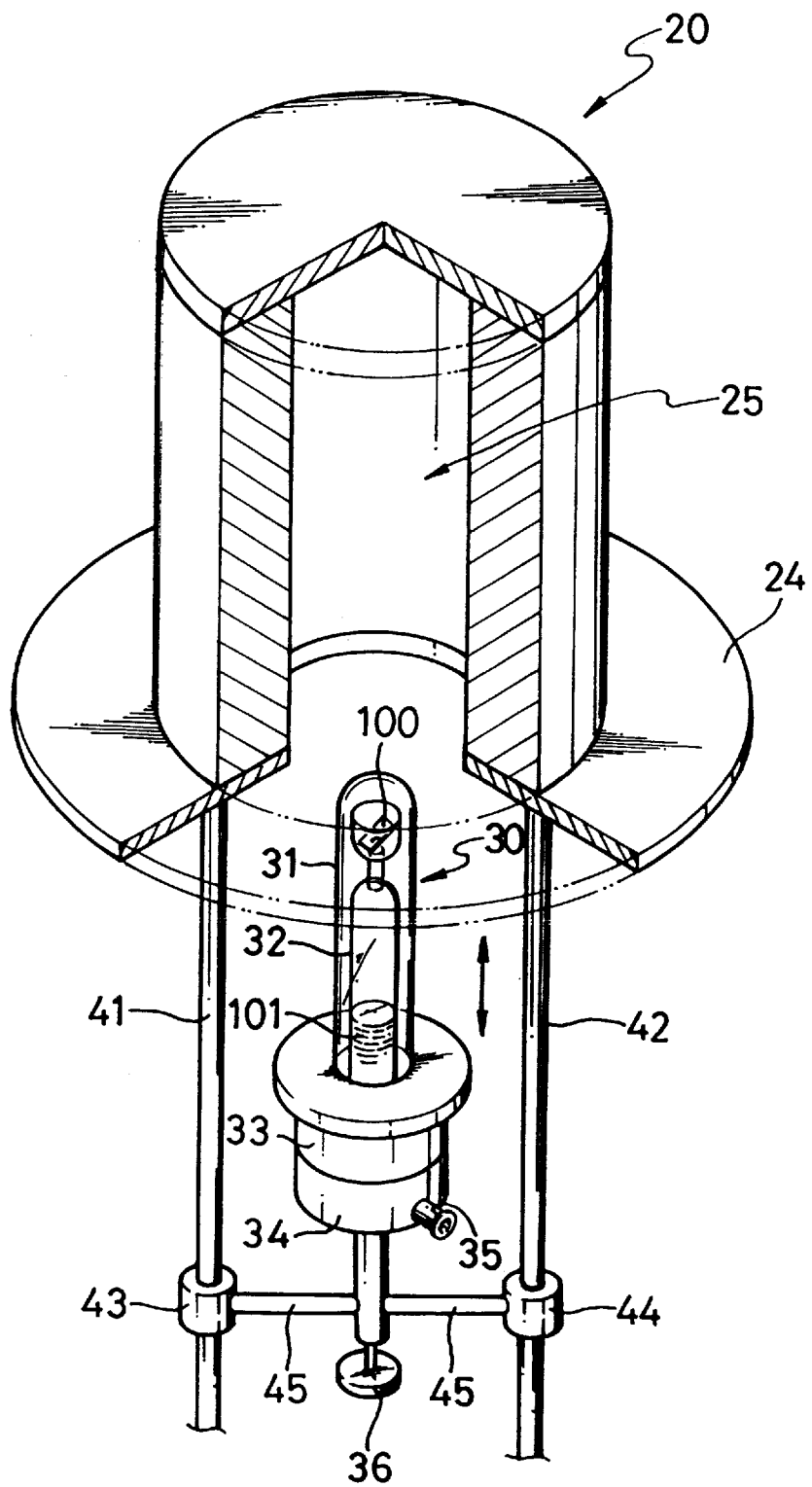
FIG. 2 is a perspective view showing a closed type semiconductor wet thermal oxidation apparatus according to the present invention.
Figure 3:
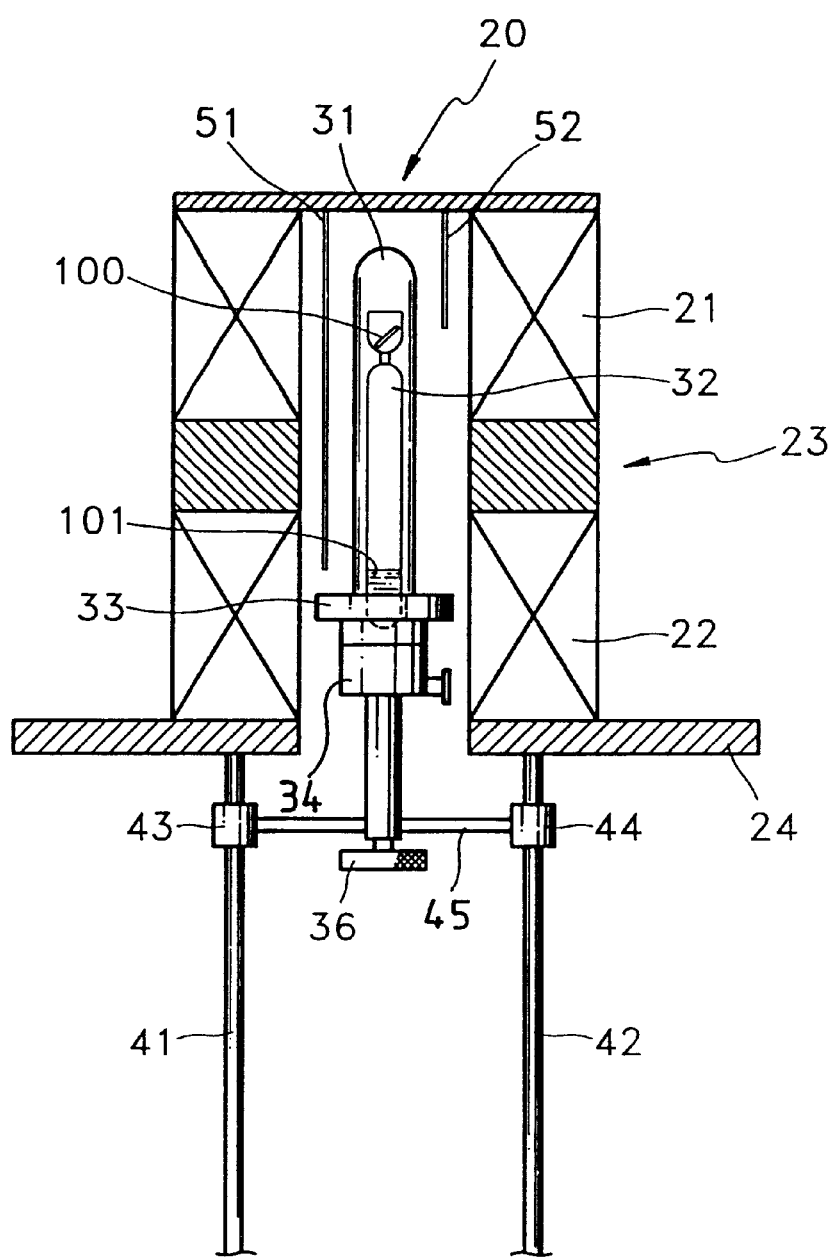
FIG. 3 is a sectional view showing the structure of the closed type semiconductor wet thermal oxidation apparatus according to the present invention.

FIGS. 2 and 3 show a closed type semiconductor wet thermal oxidation apparatus according to a preferred embodiment of the present invention. As shown in the drawing, the wet thermal oxidation apparatus according to the present invention includes a heating unit 20 for heating a specimen 100 and water 101 to generate vapor and a chamber unit 30 for accommodating the specimen 100 and the water 101 where oxidation of the specimen 100 occurs.

The heating unit 20 includes a first heating furnace 21 for heating the specimen 100 and a second heating furnace 22 for heating water to generate vapor. The first and second furnaces 21 and 22 are installed on a base 24 supported by being coupled to a supporter (not shown). The first and second heating furnaces 21 and 22 are separated from each other by a space 23 with the first heating furnace 21 near the specimen 100 and the second heating furnace 22 near water.

The first and second furnaces 21 and 22 are installed to encompass and heat the chamber unit 30 which will be described later. The first and second furnaces 21 and 22 are preferably formed to be circular around a heating space 25, but not limited to such a shape. A common electric furnace can be adopted as the furnaces 21 and 22. Also, thermocouples 51 and 52 for measuring the temperature of the water and the specimen 100 are installed in the heating space 25.

As shown in FIG. 2, the chamber unit 30 is installed to be capable of entering the heating space 25 of the heating unit 20 and retreating therefrom. That is, guide shafts 41 and 42 are installed on the lower surface of the base 24 of the heating unit 20, and sliders 43 and 44 connected with the chamber unit 30 by a support bar 45 are installed at the guide shafts 41 and 42 to be capable of sliding, so that the chamber unit 30 can ascend and descend along the guide shafts 41 and 42. The elevating means is not limited to the structure disclosed in the above preferred embodiment. Any structure capable of moving up and down the chamber unit 30 with respect to the heating space 25 of the heating unit 20 may be adopted including a technology commonly used in the field of the corresponding technology.

The chamber unit 30 includes an outside tube 31 made of glass, an installation base 33 to which the outside tube 31 is coupled and supported thereby, and an inside tube 32 installed inside the outside tube 31 for accommodating the specimen 100 and the water 101.

The outside tube 31 is detachably coupled to the installation base 33 by a typical coupling means (not shown). Preferably, the outside tube 31 and the installation form and maintain a seal. As the diameter of the inside tube 32 is less than that of the outside tube 31, the inside tube 32 can be installed at the installation base 33 in the outside tube 31. Here, the water 101 is contained in the lower portion of the inside tube 32 and the semiconductor specimen 100 to be oxidized is supported in the upper portion thereof. The positions where the specimen 100 is supported and the water 101 is contained correspond to the positions of the first and second heating furnaces 21 and 22 when the chamber unit 30 ascends and enters the heating space 25 of the heating unit 20.

Also, the installation base 33 where the inside tube 32 and the outside tube 31 are installed is coupled to a support base 34 while the inner spaces thereof are connected to each other. Preferably, a threaded portion (not shown) is formed at each of the outer circumferential surface of the installation base 33 and the inner circumferential surface of the support base 34 and the threaded portions are coupled as a bolt and nut.

A blocking valve 36 for cutting off flowing in of air is installed at the bottom surface of the support base 34 and a vacuum adapter 35 for expelling the air in the chamber unit 30 to make it a vacuous state is installed at one side thereof.

In the operation of the closed type wet thermal oxidation apparatus according to the present invention having the above structure, first, when the chamber unit 30 is situated under the heating unit 20, the first heating furnace 21 for heating the specimen 100 and the second heating furnace 22 for heating the water 101 are operated to raise the temperature thereof to desired temperatures. The temperatures are monitored by the thermocouple 52 for measuring the temperature of a heating area of the specimen 100 and the thermocouple 51 for measuring the temperature of a heating area of the water 101.

Next, the outside tube 31 of the chamber unit 30 is disassembled from the installation base 33 and the inside tube 32 is appropriately filled with the water 101. Then, the specimen 100 is placed on a specimen holder in the upper portion of the inside tube 32 and closed by the outside tube 31 forming a seal.

The installation base 33 of the chamber unit 30 containing the specimen 100 and the water 101 is coupled to the support base 34 forming a seal. Next, in a state in which a blocking valve 36 is rotated to cut off flowing in of the external air, a vacuum adaptor 35 is connected to a vacuum pump (not shown) and driven thereafter so that the inside of the outside tube 31 of the chamber unit 30 becomes a vacuous state.

When the vacuuming process of the chamber unit 30 is completed, the chamber unit 30 is moved up by a driving source (not shown) to enter the heating space 25 of the heating unit 20. Here, when the chamber unit 30 enters the heating space 25 of the heating unit 20, as the heating space is heated to a desired temperature by the first and second heating furnaces 21 and 22, the water 101 in the inside tube 32 is rapidly heated to quickly achieve a steady state and oxidation of the specimen 100 is performed.

According to the present invention, as the specimen 100 in the chamber unit 30 is sealed, there is no inflow of external air so that the oxidation atmosphere in the chamber unit 30 can be maintained in a constant state.

As described above, according to the compound semiconductor wet thermal oxidation apparatus according to the present invention, in a state in which the specimen 100 is sealed in the chamber unit 30 formed by the outside tube 31, the installation base 33 and the support base 34, water is rapidly vaporized by being heated by the heating furnaces and the specimen 100 is oxidized, so that there is no inflow of external air and the oxidation atmosphere does not change according to external circumstances. Thus, as oxidation can be made continuously at a constant atmosphere, the specimen 100 can be oxidized uniformly and also reproduction of oxidation can be secured.

Although a preferred embodiment of the chamber unit and only the heating unit are described in the present invention, the actual scope of the present invention is not limited by the drawings and descriptions above. It is obvious that various modifications may be possible within the scope of the attached claims in consideration of the functions of the chamber unit for constantly maintaining the inside atmosphere by sealing the specimen and the water and the heating unit configured to heat the chamber unit to a predetermined temperature.

What is claimed is:

1. A compound semiconductor wet thermal oxidation apparatus comprising:
  a chamber unit including an inside tube containing liquid water and supporting a specimen and an outside tube encompassing said inside tube, said outside tube forming a seal, said liquid water being a source of steam for the wet thermal oxidation reaction; and a heating unit including a furnace for heating the specimen and the liquid water.

2. The apparatus as claimed in claim 1, wherein said chamber unit comprises:
  an installation base where said inside tube is supported and said outside tube is detachably installed; and
  a support base detachably coupled to said installation base forming a seal and installed to be capable of moving towards and away from said heating unit.

3. The apparatus as claimed in claim 2, wherein said heating furnace comprises a first heating furnace for heating said specimen and a second heating furnace for heating said water.

4. The apparatus as claimed in claim 2, wherein a vacuum adaptor and a blocking valve are installed at said support base, wherein said vacuum adaptor can be connected to a vacuum pump for creating a vacuum in said outside tube and said blocking valve can cut off an inflow of external air.

5. The apparatus as claimed in claim 2, wherein a guide shaft is installed at said heating unit and said support base is coupled to a slider which slides along said guide shaft.

6. The apparatus as claimed in claim 2, wherein a threaded portion is formed at each of the outer circumferential surface of said installation base and the inner circumferential surface of said support base, said specimen and said water are provided in said inside tube, said outside tube is installed at said installation base and then said installation base and said support base are coupled by a bolt and nut.

7. The apparatus of claim 1 wherein said chamber unit can be moved away from and towards said heating unit.

8. The apparatus as claimed in claim 2, wherein said support base is installed to be capable of moving up and down with respect to said heating unit.

9. The apparatus as claimed in claim 2, wherein said guide shaft is vertically installed at said heating unit.

\* \* \* \* \*